(12) United States Patent
Kobayakawa

(10) Patent No.: US 6,913,950 B2
(45) Date of Patent: Jul. 5, 2005

(54) SEMICONDUCTOR DEVICE WITH CHAMFERED SUBSTRATE AND METHOD OF MAKING THE SAME

(75) Inventor: Masahiko Kobayakawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/457,637

(22) Filed: Jun. 9, 2003

(65) Prior Publication Data

US 2003/0209788 A1 Nov. 13, 2003

Related U.S. Application Data

(62) Division of application No. 09/903,104, filed on Jul. 11, 2001, now Pat. No. 6,611,049.

(30) Foreign Application Priority Data

Jul. 12, 2000 (JP) ........................................ 2000-211073

(51) Int. Cl.⁷ .................... H01L 21/44; H01L 21/48; H01L 21/50; H01L 23/48; H01L 23/52
(52) U.S. Cl. .................... 438/113; 438/126; 257/774; 264/272.17
(58) Field of Search ............... 438/113, 126; 257/774; 264/272.17

(56) References Cited

U.S. PATENT DOCUMENTS

| 4,819,041 | A | | 4/1989 | Redmond |
| 5,212,115 | A | * | 5/1993 | Cho et al. ................... 438/51 |
| 5,304,844 | A | | 4/1994 | Horiuchi et al. |
| 5,625,222 | A | | 4/1997 | Yoneda et al. |
| 5,834,799 | A | | 11/1998 | Rostoker et al. |
| 5,985,695 | A | * | 11/1999 | Freyman et al. ............ 438/112 |
| 6,344,609 | B1 | | 2/2002 | Nakano |

FOREIGN PATENT DOCUMENTS

JP          11-297752          10/1999

* cited by examiner

Primary Examiner—Craig A. Thompson
Assistant Examiner—Nema Berezny
(74) Attorney, Agent, or Firm—Hamre, Schumann, Mueller & Larson, P.C.

(57) ABSTRACT

A semiconductor device includes an insulating substrate, a cutout formed in side surfaces of the substrate, a conductive pad formed on the obverse surface of the substrate, an electrode formed on the reverse surface of the substrate, a semiconductor chip mounted on the substrate, and a connector which connects the pad to the electrode. The connector is arranged in the cutout.

7 Claims, 16 Drawing Sheets

US 6,913,950 B2

SEMICONDUCTOR DEVICE WITH CHAMFERED SUBSTRATE AND METHOD OF MAKING THE SAME

BACKGROUND OF THE INVENTION

1. Field of the Invention

The present invention relates to a leadless semiconductor device with a substrate chamfered for providing a connector. It also relates to a method of making such a semiconductor device.

2. Description of the Related Art

FIGS. 24 and 25 of the accompanying drawings show an example of conventional semiconductor device. The illustrated device includes a ceramic substrate 90, a semiconductor chip 91 mounted on the substrate, and a resin package 92 enclosing the chip 91. The chip 91 is provided with electrodes (not shown) which are directly or indirectly (i.e., via wires W) connected to pads 93 formed on the upper surface of the substrate 90. On its lower surface, the substrate 90 is formed with terminals 94 connected to the pads 93 via connection holes 8.

Referring to FIG. 26, the conventional device is fabricated in the following manner. First, a mother substrate 90A of unbaked inorganic material is prepared. Then, pads 93 are formed on the upper surface of the mother substrate 90A. The pads 93 include a number of pairs of one larger pad and two smaller pads. Though not shown in FIG. 26, a plurality of terminals (reference numeral 94 in FIG. 25) are formed on the lower surface of the mother substrate 90A. These terminals are connected to the larger and smaller pads 93 by connection holes 8 (shown in broken lines). Each connection hole 8 is produced by stuffing tungsten powder into a through-hole formed in the mother substrate 90A. Then, the mother substrate 90A is baked at a temperature of about 1200° C. Thereafter, semiconductor chips 91 are mounted on the larger ones of the pads 93 in electrical conduction therewith, and enclosed with resin material. Finally, the mother substrate 90A is cut along the predetermined lines N1, N2, thereby providing a plurality of semiconductors as shown in FIG. 24.

While the illustrated prior art is functional, it also has the following drawbacks.

First, since the substrate 90 needs to be formed with several connection holes 8, the downsizing of the substrate (hence the device as a whole) is rather difficult.

Second, the collective fabrication process (FIG. 26) of the prior art is time-consuming due to many connection holes 8 to be made in the mother substrate 90A.

Third, the inorganic mother substrate 90A tends to deform when it is subjected to baking. Disadvantageously, such deformation may cause positional deviation of the pads 93 or terminals 94.

SUMMARY OF THE INVENTION

The present invention has been proposed under the circumstances described above. It is, therefore, an object of the present invention to provide advantageously smaller semiconductor devices and a time-saving method of making such devices.

According to a first aspect of the present invention, there is provided a semiconductor device including: an insulating substrate having an obverse surface, a reverse surface and side surfaces extending between the obverse and the reverse surfaces; a cutout formed in at least one of the side surfaces of the substrate; a conductive pad formed on the obverse surface of the substrate; an electrode formed on the reverse surface of the substrate; a semiconductor chip mounted on the substrate in electrical conduction with the pad; and a connector which connects the pad to the electrode, wherein the connector is arranged in the cutout.

Preferably, the connector may include a conductive layer attached to a wall surface of the cutout.

Preferably, the insulating substrate may be made of an organic material.

Preferably, the semiconductor device may further include a resin package enclosing the semiconductor chip.

Preferably, the package may be held out of contact with the connector by the conductive pad.

Preferably, the package may include a leg portion which reaches the cutout, thereby concealing the connector. The leg portion may include an end surface flush with the reverse surface of the substrate.

The device of the present invention may include a filler disposed at the cutout. The filler may be prepared separately from the package.

Preferably, the filler may include a flat surface parallel to either the obverse or reverse surface of the substrate, wherein the flat surface is held in contact with either the pad or electrode.

Preferably, the substrate may have a rectangular configuration, and the cutout is disposed at one of the four corners. Alternatively, the cutout may be disposed between two adjacent corners.

Preferably, the cutout may be one part of a quartered circular hole.

According to a second aspect of the present invention, there is provided a method of making a semiconductor device. The method may include the following steps. First, an insulating substrate having an obverse surface and a reverse surface is prepared. Then, an upper conductive pattern and a lower conductive pattern are formed on the obverse surface and the reverse surface, respectively. Then, a connection hole is formed in the substrate for making the electrical connection between the upper conductive pattern and the lower conductive pattern. Then, a semiconductor chip is mounted on the substrate. Then, a resin coating is formed on the substrate to enclose the semiconductor chip. Finally, the substrate is divided along cut lines which intersect the connection hole.

Preferably, the cut lines may cross each other at the center of the connection hole.

Preferably, the method may further include the step of providing closure on the obverse surface of the substrate, so that the closure prevents the resin coating from entering the connection hole. Alternatively, the resin coating may be allowed to enter the connection hole.

Preferably, the method of the present invention may include the step of filling the connection hole with a filler prior to the resin coating forming step. Preferably, the method of the present invention may include the step of providing a conductive layer held in contact with the filler.

Other features and advantages of the present invention will become apparent from the detailed description given below with reference to the accompanying drawings.

DETAILED DESCRIPTION OF THE PREFERRED EMBODIMENT

The preferred embodiments of the present invention will be described below with reference to the accompanying drawings.

Figure 1:
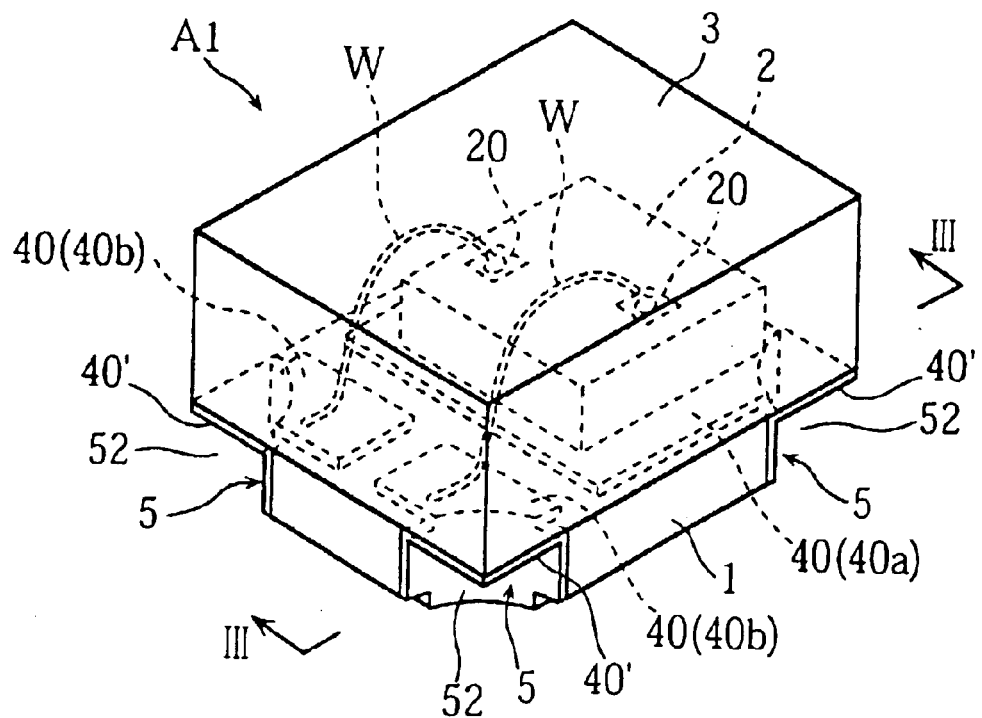
FIG. 1 is a perspective view showing a semiconductor device according to a first embodiment of the present invention.
Figure 2:
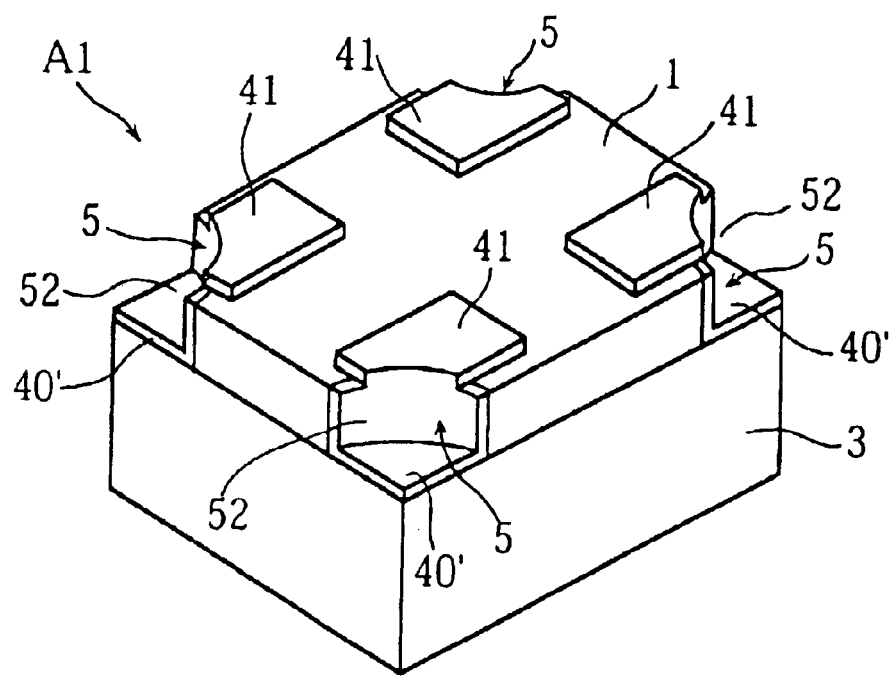
FIG. 2 illustrates the bottom layout of the semiconductor device of FIG. 1.
Figure 3:
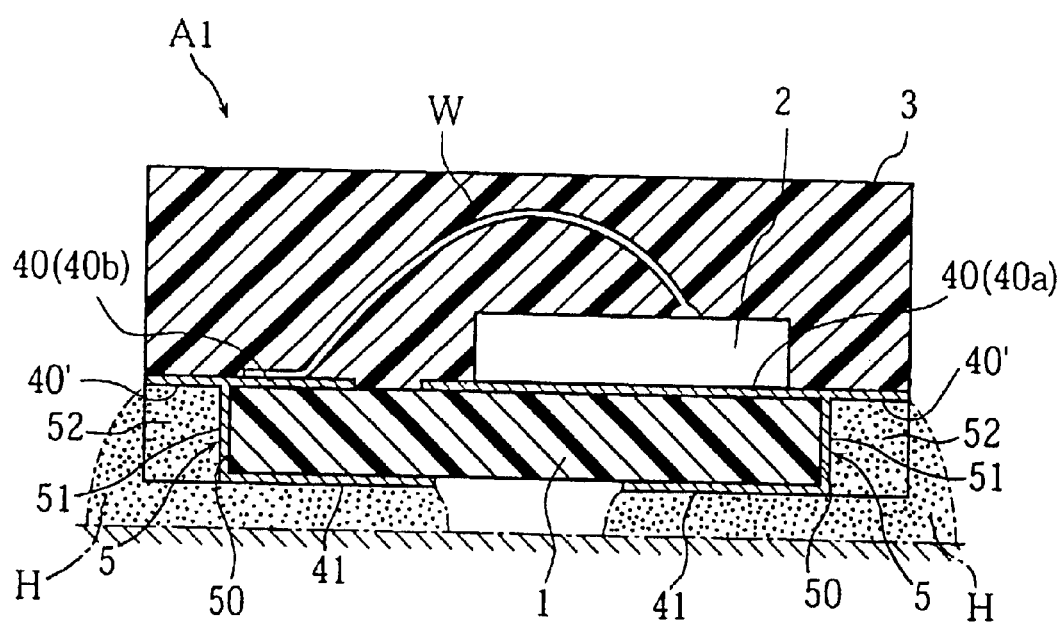
FIG. 3 is a sectional view taken along lines III—III in FIG. 1.

Reference is first made to FIGS. 1–3 illustrating a semiconductor device according to a first embodiment of the present invention. The illustrated device A1 includes an insulating substrate 1, a semiconductor chip 2 supported by the substrate 1, and a resin package 3.

The substrate 1 is made of an organic material such as glass fiber reinforced epoxy resin (simply called "glass epoxy" hereinafter). The substrate 1 is provided, on its upper surface, with three conductive pads 40 (one larger pad 40a and two smaller pads 40b), as seen from FIG. 1. These pads may be made of copper or aluminum. On its lower surface (see FIG. 2), the substrate 1 is provided with four electrodes 41. These electrodes may also be made of copper or aluminum.

As best shown in FIG. 2, the four corners of the substrate 1 are chamfered, whereby four cutout portions 52 are provided. Accordingly, each of the electrodes 41, which would otherwise have a complete rectangular form, has one corner removed. The upper pads 40, on the other hand, include overhangs 40' extending laterally over the cutout portions 52. The pads 40 are held in electrical conduction with the electrodes 41 through connectors 5. Precisely, the larger pad 40a is connected to two electrodes 41 by two connectors 5, respectively, while each smaller pad 40b is connected to one electrode 41 by one connector 5.

The semiconductor chip 2 is bonded to the larger pad 40a in electrical conduction therewith. As shown in FIG. 1, the chip 2 is provided with two electrodes 20 connected to the smaller pads 40b via wires W. The semiconductor chip 2 may be a transistor chip, diode chip, etc.

The package 3, made of e.g. epoxy resin, is provided on the upper surface of the substrate 1, to enclose the chip 2, the wires W and the pads 40. The package 3 is separated from the cutout portions 52 by the overhangs 40' of the pads 40.

The semiconductor device A1 with the above structure may be fabricated in the following manner.

Figure 4:
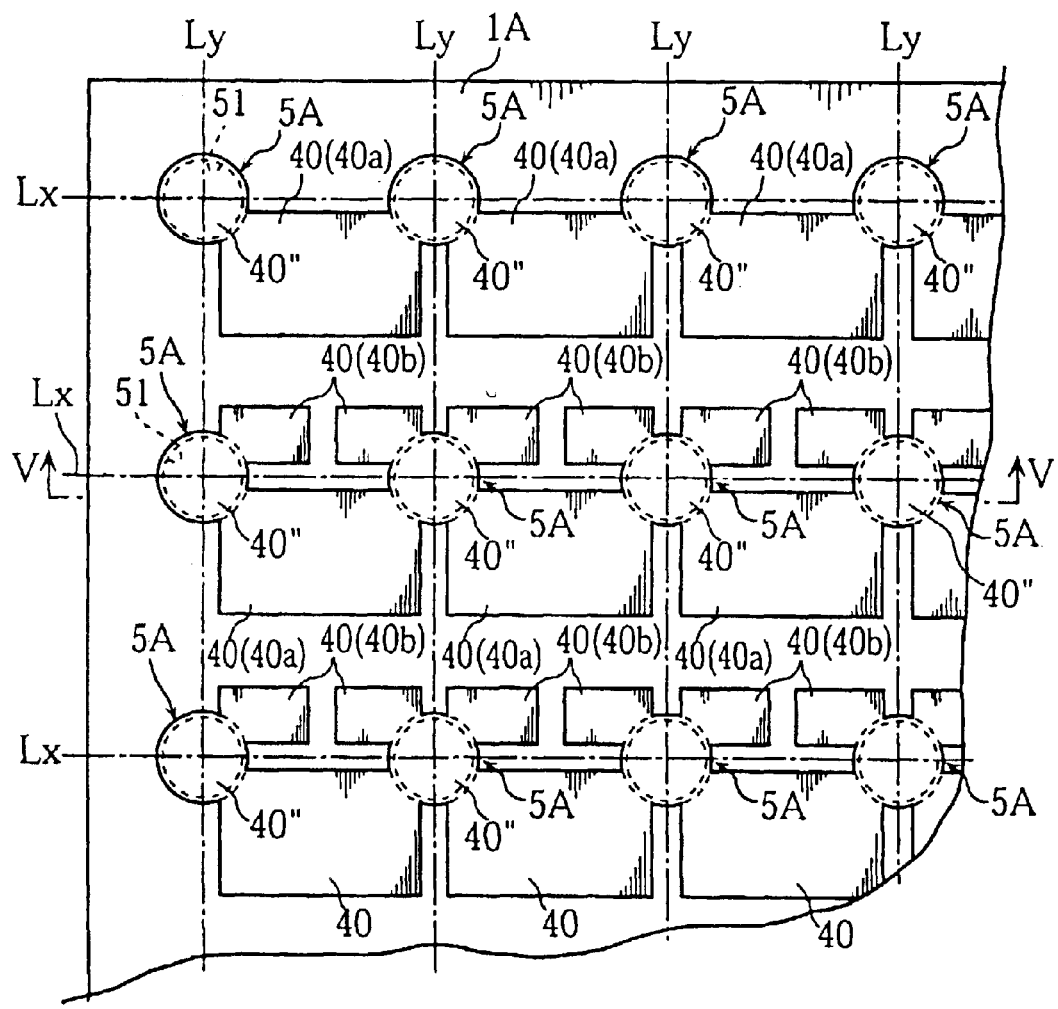
FIG. 4 is a plan view showing a principal portion of a mother substrate used for fabricating the semiconductor device of the first embodiment.
Figure 5:
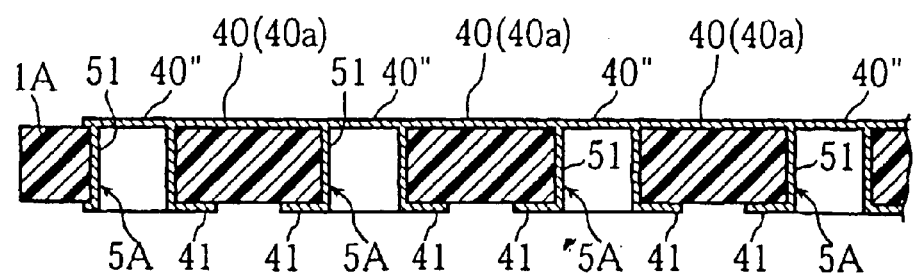
FIG. 5 is a sectional view taken along lines V—V in FIG. 4.
Figure 6:
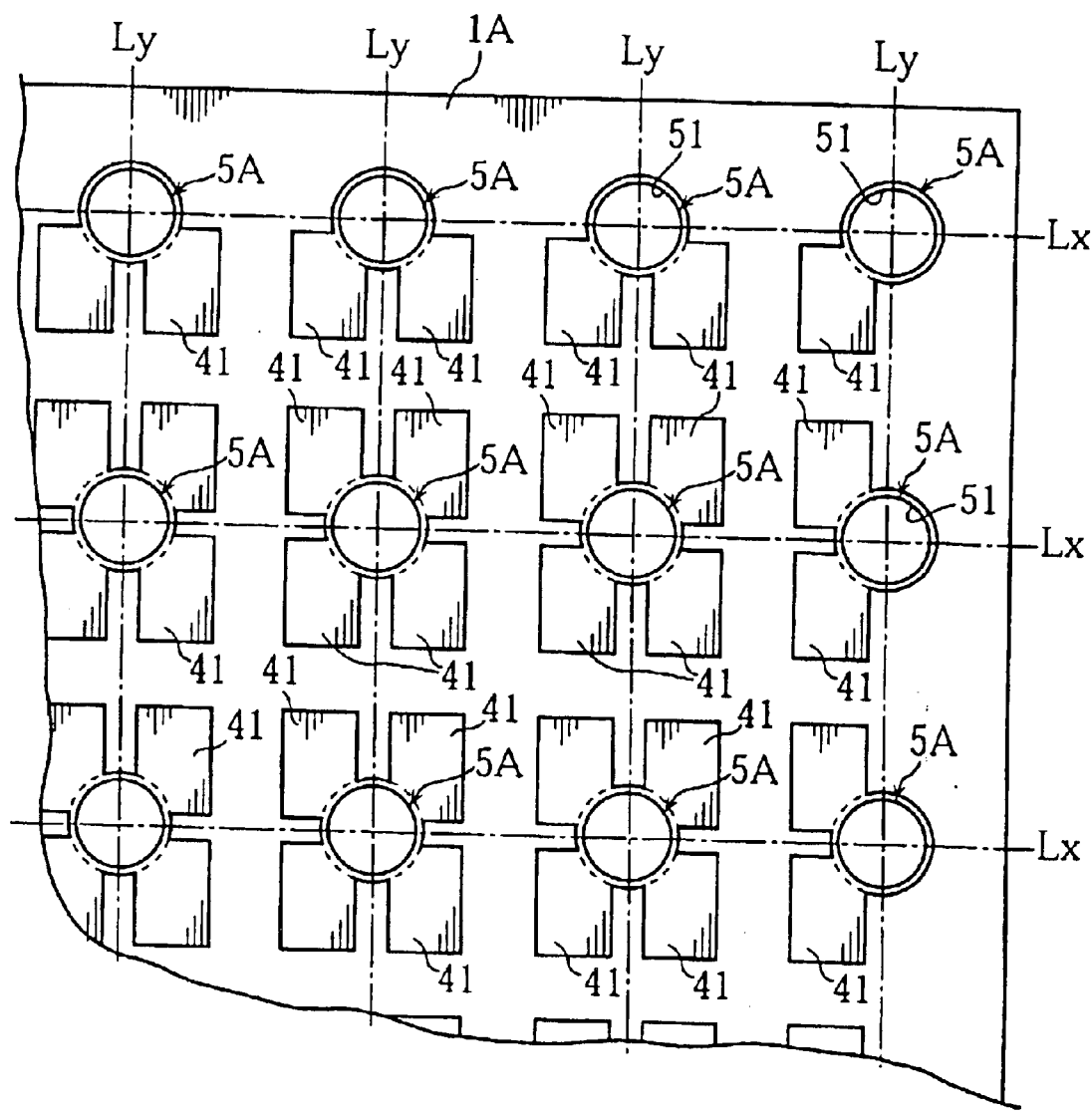
FIG. 6 shows the bottom view of a principal portion of the mother substrate.

First, a mother substrate 1A shown in FIGS. 4–6 is prepared. The mother substrate 1A is much larger than the substrate 1 of the semiconductor device A1. The upper surface of the substrate 1A, as shown in FIGS. 4 and 5, is provided with a predetermined conductive pattern 40, which will result in the pads 40 of the device A1. On the other side, as shown in FIGS. 5 and 6, the substrate 1A is provided with a conductive pattern 41, which will result in the electrodes 41 of the device A1. The upper conductive pattern 40 is connected to the lower conductive pattern 41 via a plurality of connection holes 5A formed in the mother substrate 1A. The center of each connection hole 5A coincides with the intersection of the cut lines Lx and Ly perpendicular to each other. Thus, at the latter substrate-dividing step, each connection hole 5A will be quartered. As shown in FIG. 5, the connection hole 5A is made of a conductive layer 51 formed on the inner wall surface of a through-hole. The connection hole 5A is closed at its upper end by a circular portion 40" of the conductive pattern 40.

The above features of the mother substrate 1A may be obtained in the following manner. First, the mother substrate 1A is subjected to electrodeless copper-plating to form a conductive layer on each of the upper and the lower surfaces of the substrate 1A. Then, unnecessary portions of the obtained copper layers are removed by etching so that the desired conductive patterns are obtained. At this stage, the circular portions 40" have not been formed yet. Then, the connection holes 5A are formed in the substrate 1A. Specifically, first, press working or laser processing may be used for making through-holes in the substrate 1A. Then, the inner wall surface of each through-hole is copper-plated.

After the connection holes 5A are formed in the above manner, the circular portions 40" are produced on the upper surface of the substrate 1A to close the upper openings of the respective copper-plated bores. The circular portions 40" may be provided by copper foil placed on the mother substrate 1A.

Figure 7:
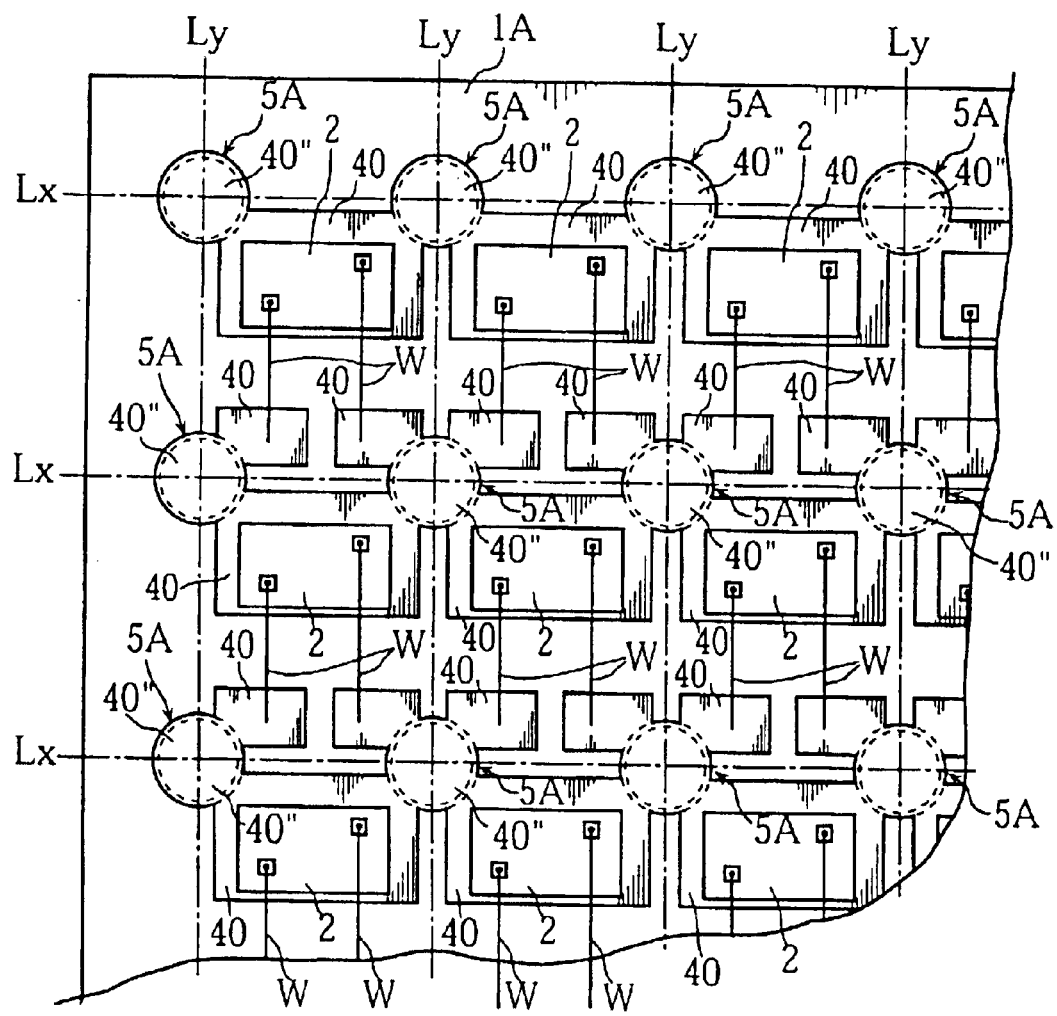
FIG. 7 shows how semiconductor chips are mounted on the mother substrate.

Then, as shown in FIG. 7, the semiconductor chips 2 are mounted onto the conductive pattern (onto the portions 40a in FIG. 4). This is followed by the required wire-bonding process using wire W. Thereafter, though not shown in the figure for simplicity of illustration, epoxy resin is applied on the mother substrate 1A for forming a resin coating layer to collectively package all the semiconductor chips 2. The applied resin material does not flow into the connection holes 5A due to the circular portions 40".

After the resin material solidifies, the mother substrate 1A together with the resin coating is cut along the lines Lx, Ly by a rotary cutting blade for example. Thus, a plurality of identical semiconductor devices as shown in FIGS. 1–3 are obtained.

As seen from the above, the cutout portions 52, the connectors 5 and the overhangs 40" (FIGS. 1–3) result from the "quarter sectioning" of the connection holes 5A (FIG. 7).

According to the above fabrication method, it is possible to make smaller the number of the connection holes 5A to be made in the mother substrate 1A in comparison with the prior art device. This is because one connection hole is shared by at least two (at most four) semiconductor devices, as seen from FIG. 7. Advantageously, this reduces the number of connection holes to be made in the mother substrate, whereby the fabrication procedure takes less time as a whole.

Figure 24:
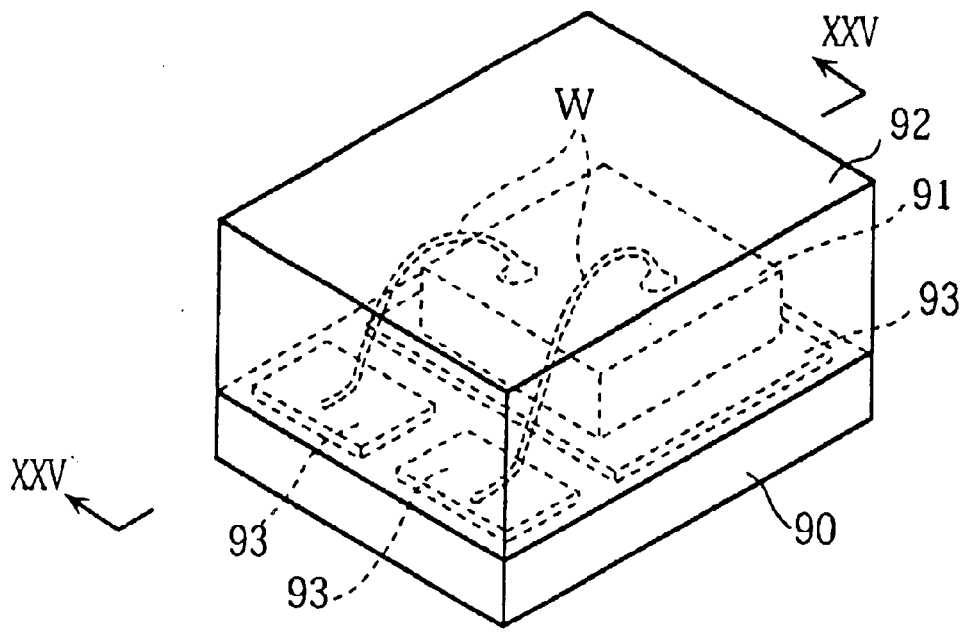
FIG. 24 is a perspective view showing a conventional semiconductor device.
Figure 25:
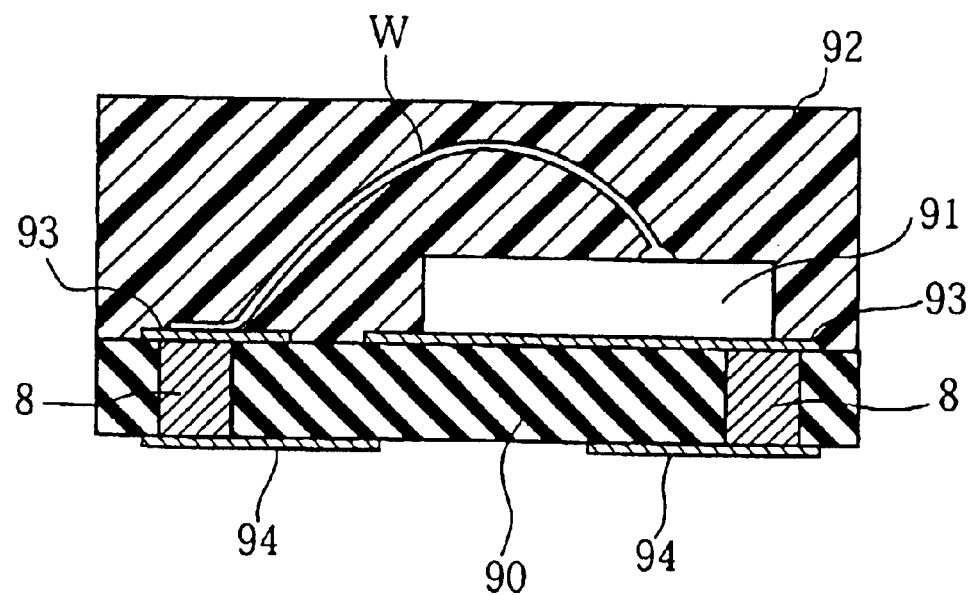
FIG. 25 is a sectional view taken along lines XXV—XXV in FIG. 24.
Figure 26:
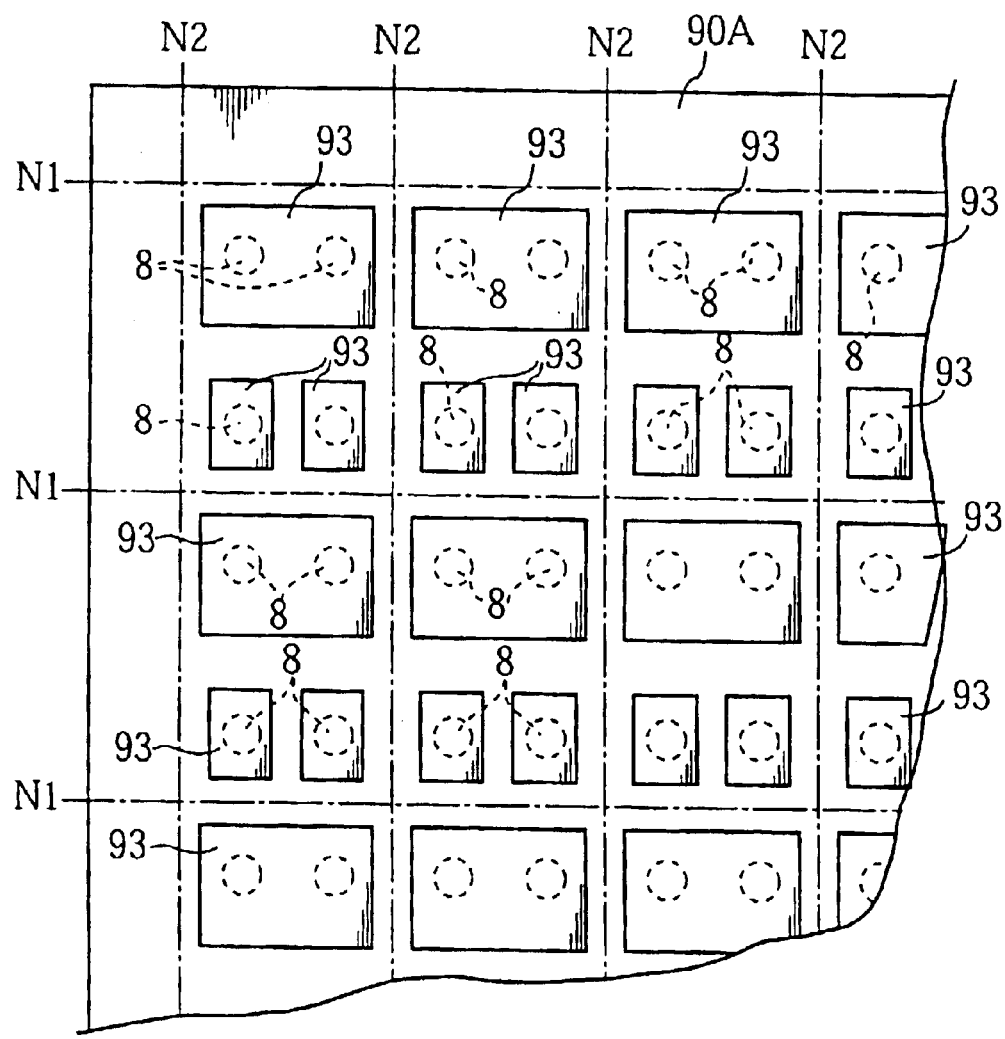
FIG. 26 is a plan view showing a principal portion of a mother substrate used for fabricating the conventional semiconductor device.

Another advantage is that the semiconductor device A1 of the present invention can be made smaller than the prior art device (FIG. 24) since the substrate 1 can be made smaller. Specifically, supposing that the cross-sectional area of a connection hole is constant (say S square millimeters), the substrate 1 of the present invention needs only an area of S square millimeters (i.e., 4 times S/4) for forming the connectors 5, while the prior art substrate 90 (FIG. 24) needs an area of 4×S square millimeters for forming four connection holes. Accordingly, the substrate 1 has a reduced size than the prior art substrate. In addition, the connectors 5 are provided at the corners of the substrate 1. Thus, the inner portions of the substrate 1 can be put to more effective use than when part of these portions is dedicated to forming connection holes.

Further, in the semiconductor device A1, the connectors 5 remain uncovered by the package 3 or any other thing. This structure makes it easy to perform the quality inspection of the connectors 5. Also, the substrate 1 does not need to be baked since it is made of organic material (glass epoxy). Thus, as opposed to the prior art, positional deviation of the pads 40 or electrodes 41 will not occur.

As previously describe, the semiconductor device A1 is provided with flat electrodes 41 on its bottom. Thus, the device A1 can readily be surface mounted onto a printed circuit board by e.g. reflow soldering. In the soldering process, as shown in FIG. 3, a solder fillet H is formed at each cutout portion 52. This helps the semiconductor device A1 to be firmly attached to the circuit board. According to the present invention, the solder fillet H may be confined within the cutout portion 52, or may laterally bulge (FIG. 3). For an increased mounting density, the confined fillet may be preferable, whereas for securer fixation, the bulging fillet H may be preferable.

Figure 8:
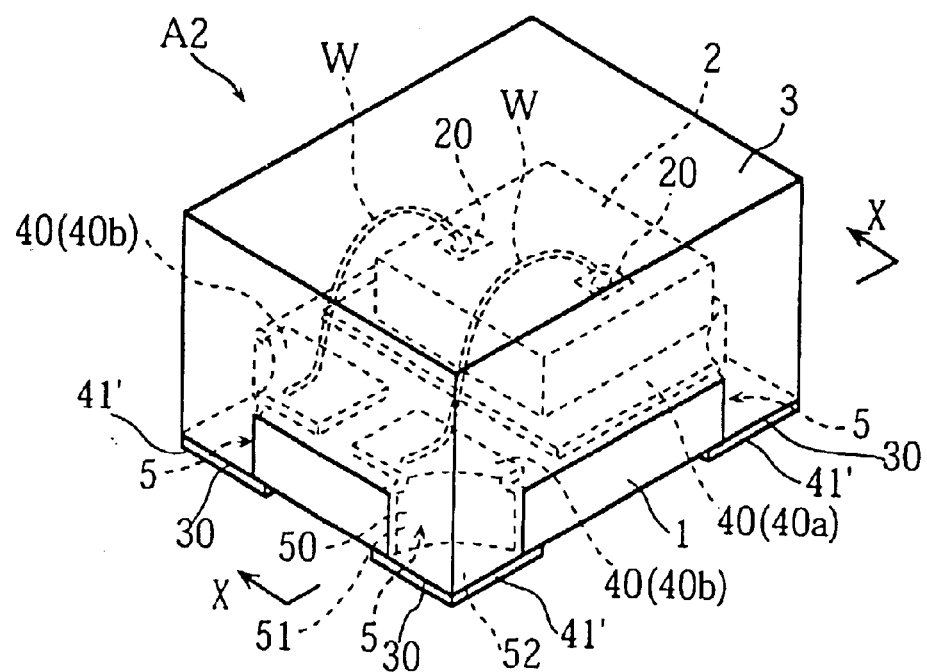
FIG. 8 is a perspective view showing a semiconductor device according to a second embodiment of the present invention.
Figure 9:
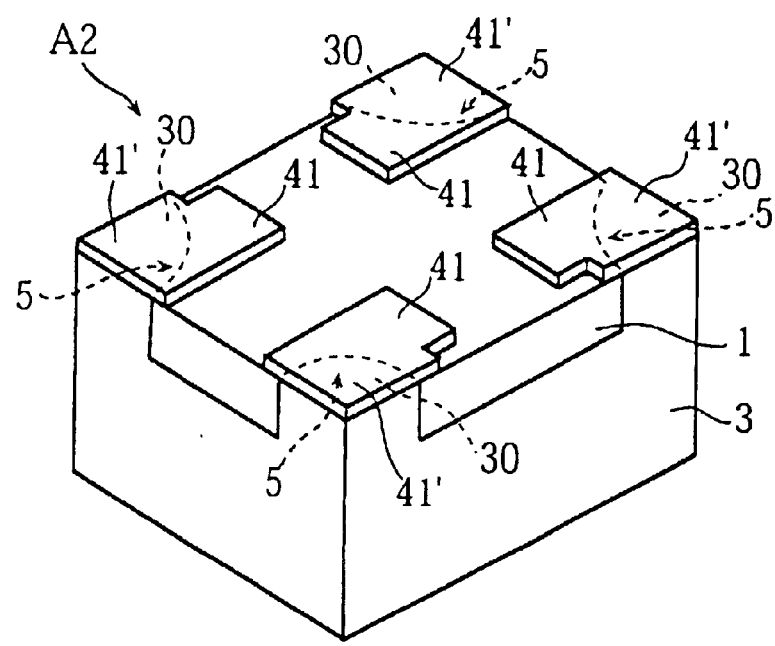
FIG. 9 shows the bottom layout of the semiconductor device of the second embodiment.
Figure 10:
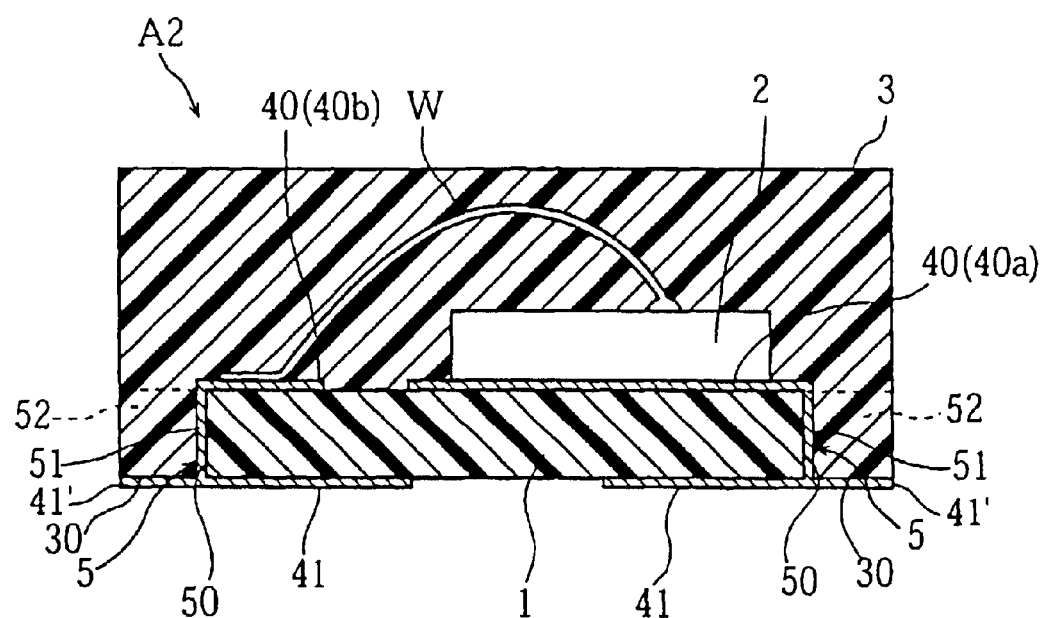
FIG. 10 is a sectional view taken along lines X—X in FIG. 8.

Reference is now made to FIGS. 8–10 illustrating a semiconductor device A2 according to a second embodiment of the present invention. The device A2 of the second embodiment is basically the same as the device A1 of the first embodiment, except for the following points.

Specifically, in the device A2, each pad 40 does not include an overhang as found in the device A1 (see the portion 40' in FIG. 1) for blocking the entry of the resin package 3 into the cutout portion 52. Instead, as shown in FIG. 8, the package 3 is allowed to extend into the respective cutout portions 52. These extending parts of the package 3 have end surfaces 30 which are flush with the bottom surface of the substrate 1, as shown in FIG. 10. Each of the electrodes 41 includes a sectorial portion 41' held in engagement with the relevant end surface 30.

Figure 11:
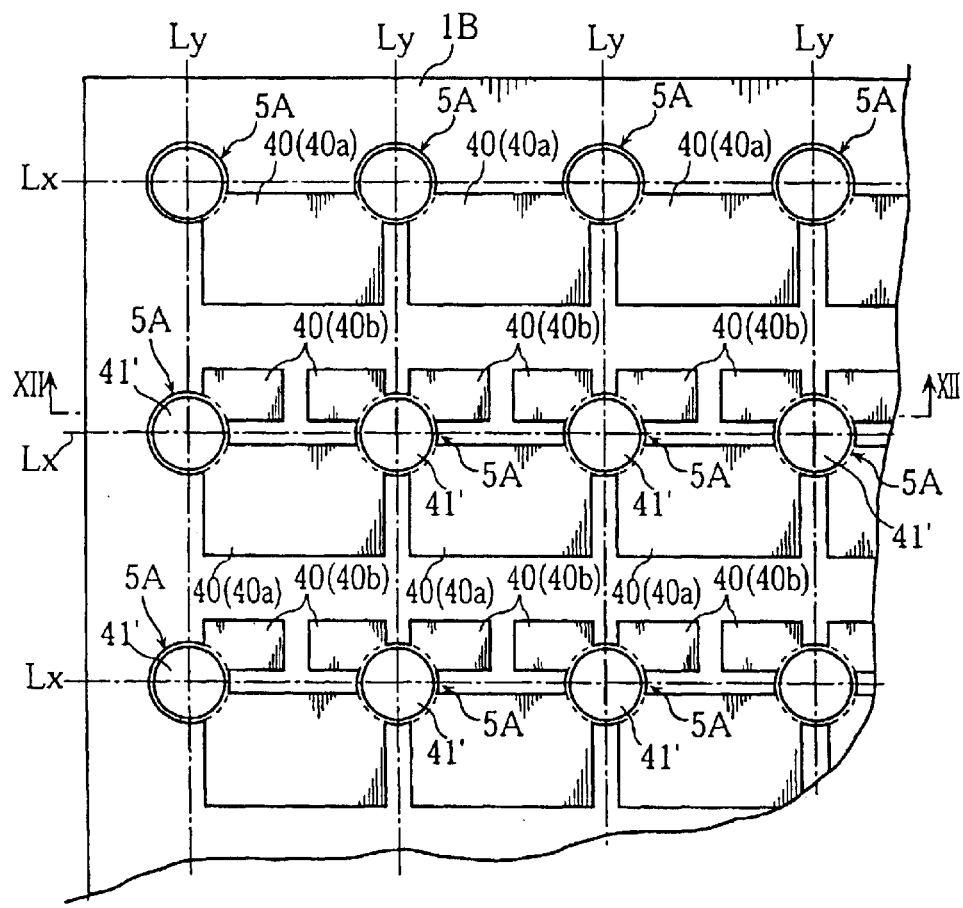
FIG. 11 is a plan view showing a principal portion of a mother substrate used for fabricating the semiconductor device of the second embodiment.
Figure 12:
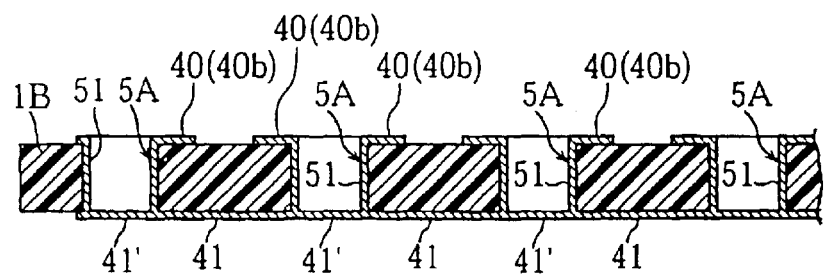
FIG. 12 is a sectional view taken along lines XII—XII in FIG. 11.

Referring to FIGS. 11 and 12, the semiconductor device A2 may be fabricated in the following manner.

First, the mother substrate 1B as illustrated is prepared. The upper conductive pattern shown in FIG. 11 is basically the same as that shown in FIG. 4, except that it does not close the connection holes 5A. On the other hand, as shown in FIG. 12, the sectorial portions 41' of the lower conductive pattern close the lower openings of the connection holes 5A.

Then, semiconductor chips are mounted on the substrate 1B. Thereafter, a molten resin package material is applied on the upper surface of the substrate 1B, to enclose the chips. At this stage, the applied material flows into the respective connection holes 5A, but is checked by the sectorial portions 41' of the lower conductive pattern.

After the solidification of the resin material, the mother substrate 1B, together with the resin coating, is cut along the lines Lx, Ly. Thus, a plurality of semiconductor devices as shown in FIG. 8 are obtained.

Figure 13:
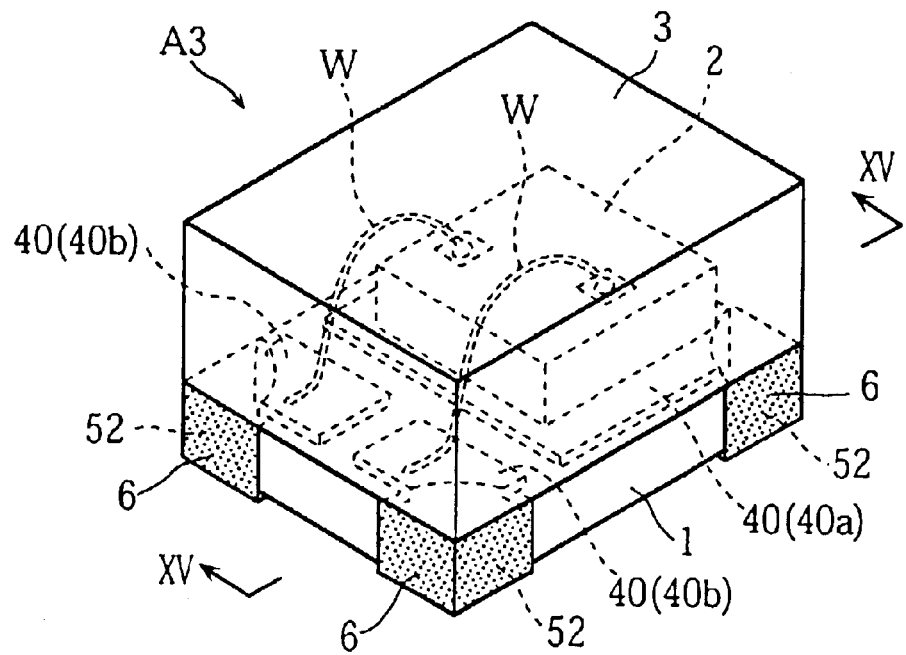
FIG. 13 is a perspective view showing a semiconductor device according to a third embodiment of the present invention.
Figure 14:
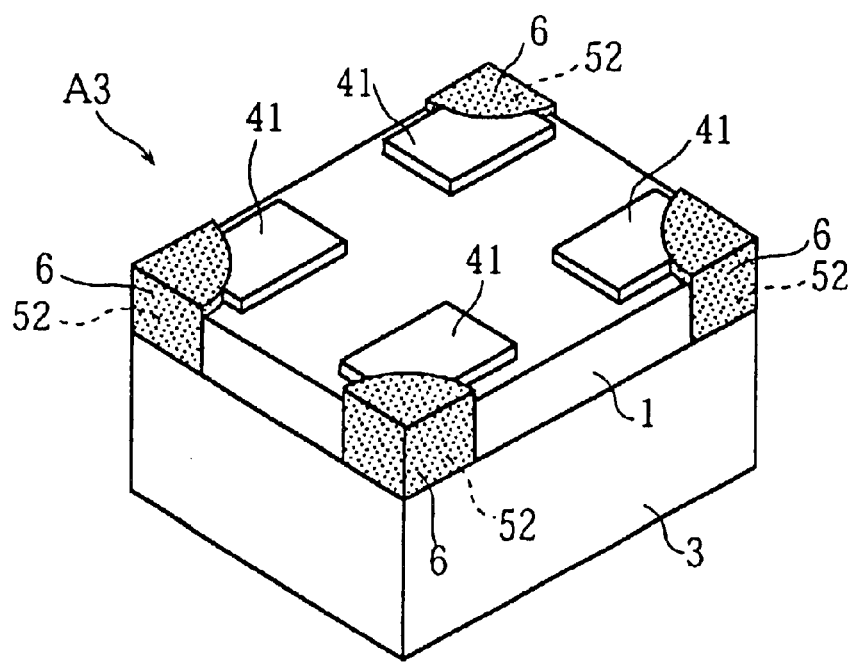
FIG. 14 shows the bottom layout of the semiconductor device of the third embodiment.
Figure 15:
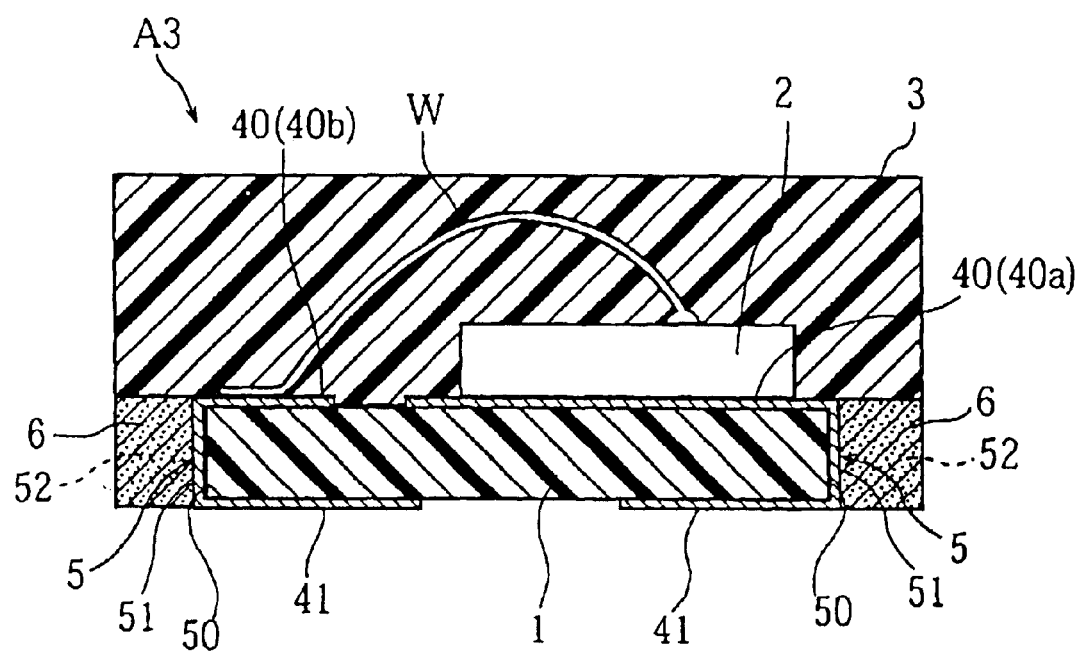
FIG. 15 is a sectional view taken along lines XV—XV in FIG. 13.

FIGS. 13–15 show a semiconductor device according to a third embodiment of the present invention. The illustrated device A3 is basically the same as the device A1 shown in FIG. 1, except that each of the cutout portions 52 is filled with a filler 6 prepared separately from the resin package 3, and that the pads 40 and the electrodes 41 do not have an overhang 40' (as the one shown in FIG. 1) nor sectorial portion 41' (as the one shown in FIG. 8). The filler 6 may be made of an insulating material (such as photosensitive polyimide) or conductive material.

Figure 16:
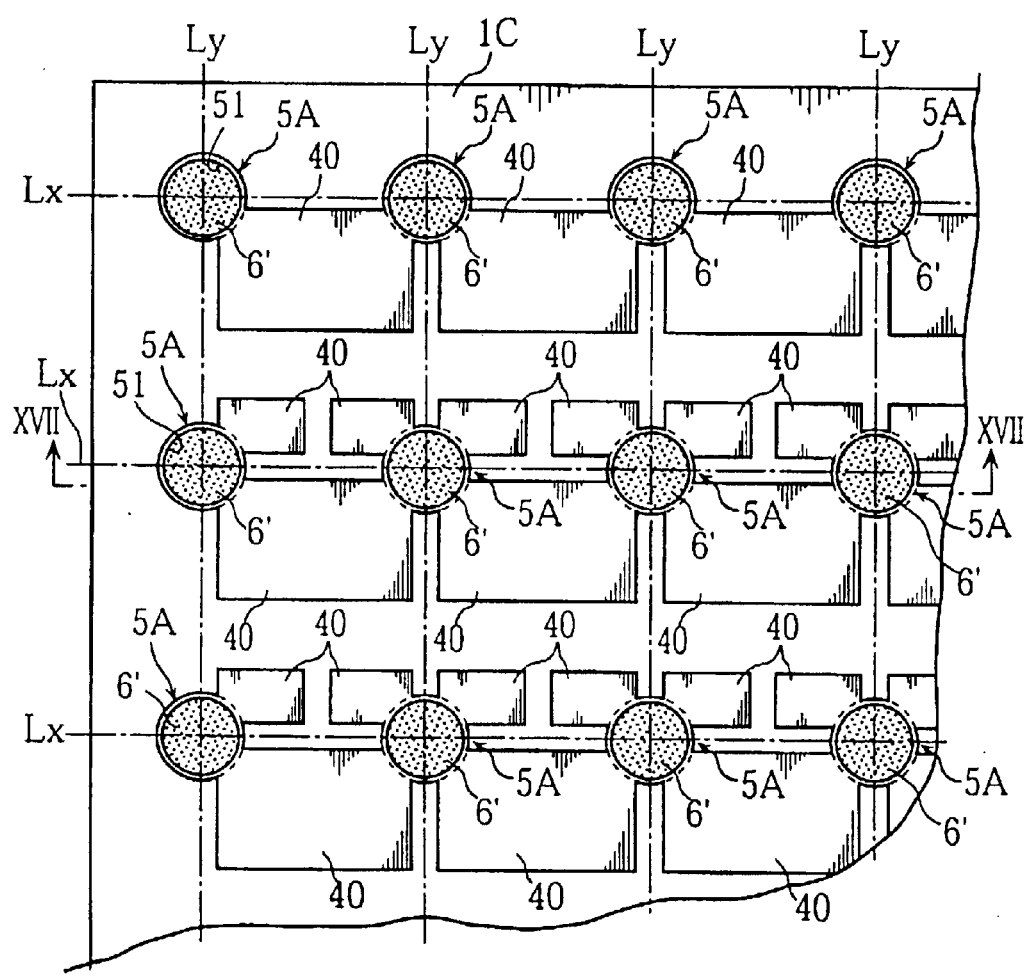
FIG. 16 is a plan view showing a principal portion of a mother substrate used for fabricating the semiconductor device of the third embodiment.
Figure 17:
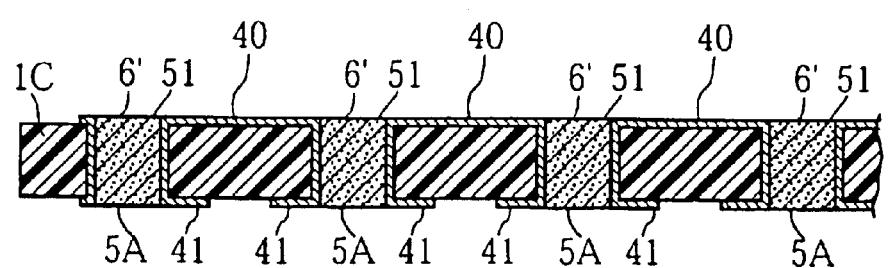
FIG. 17 is a sectional view taken along lines XVII—XVII in FIG. 16.

The semiconductor device A3 may be fabricated by using a mother substrate 1C shown in FIGS. 16 and 17. The substrate 1C is formed with a plurality of connection holes 5A which are not closed by the upper nor lower conductive pattern formed on the substrate 1C. Each of the connection holes 5A includes a filler 6'. As in the first or second embodiment, semiconductor chips are mounted on the substrate 1C, and then a resin coating is formed to enclose the chips. Due to the filler 6', the molten resin material does not flow into the connection holes 5A. The substrate 1C, together with the solidified resin, is cut along the lines Lx, Ly, to produce a plurality of semiconductor devices as shown in FIG. 13.

Figure 18:
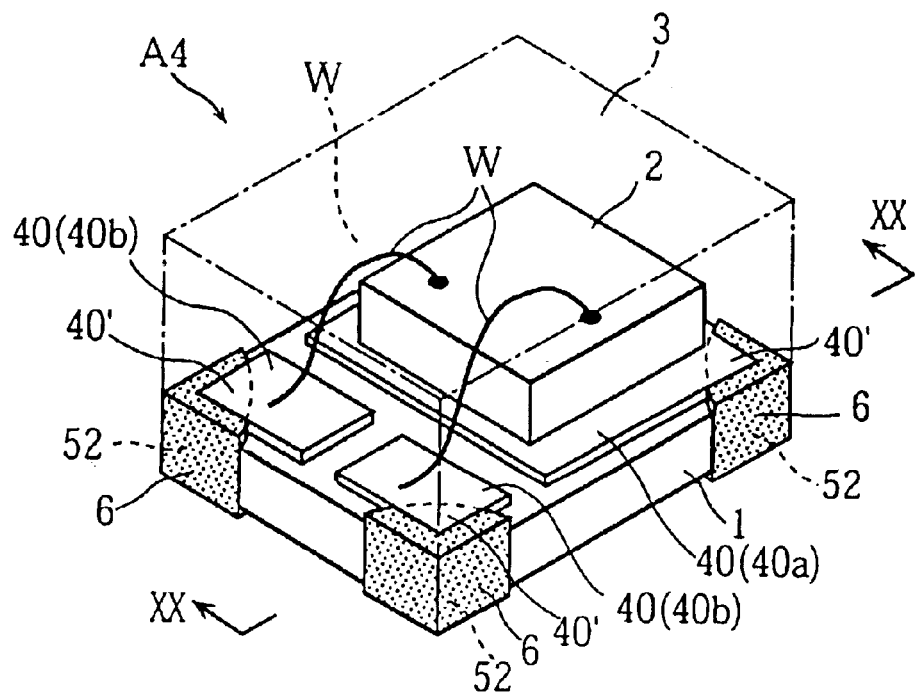
FIG. 18 is a perspective view showing a semiconductor device according to a fourth embodiment of the present invention.
Figure 19:
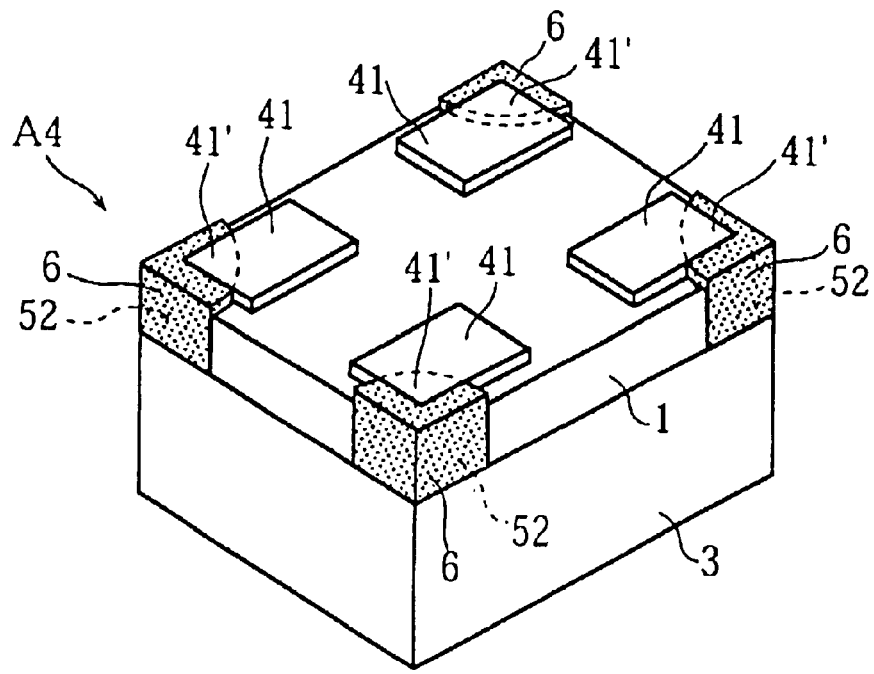
FIG. 19 shows the bottom layout of the semiconductor device of the fourth embodiment.
Figure 20:
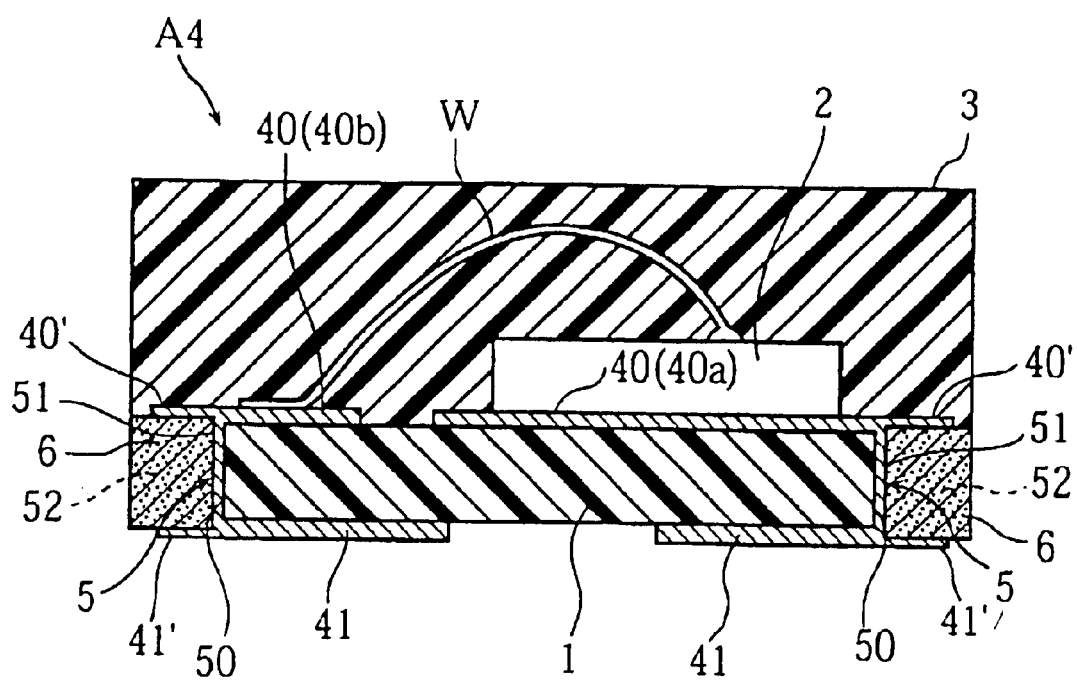
FIG. 20 is a sectional view taken along lines XX—XX in FIG. 18.

FIGS. 18–20 show a semiconductor device A4 according to a fourth embodiment of the present invention.

As in the third embodiment described above, the device A4 also includes fillers 6 disposed at the cutout portions 52 of the substrate 1. However, in the device A4, the pads 40 and the electrodes 41 include a laterally jutting portion 40' or 41'.

Figure 21:
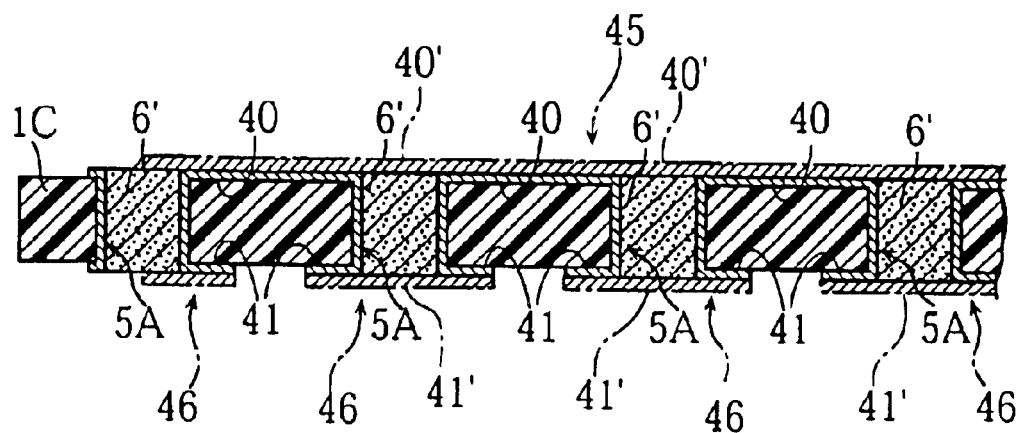
FIG. 21 is a sectional view showing a mother substrate used for fabricating the semiconductor device of the fourth embodiment.

The semiconductor device A4 may be fabricated by using a mother substrate 1D shown in FIG. 21. The substrate 1D is obtained from the above-described substrate 1C (FIG. 17). Specifically, a substrate 1C is prepared, and then copper foils 45 and 46 are laid on the upper conductive patterns 40 and 41, respectively. The filler 6' is covered by the portion 40' of the foil 45 (at its upper end) and by the portion 41' of the foil 46 (at its lower end).

After the forming of the foils 45 and 46, semiconductor chips are mounted on the substrate 1D, resin coating is formed to enclose the chips, and finally the substrate 1D together with the resin coating is cut along the predetermined lines.

According to the fourth embodiment, the connectors 5 are protected against mechanical damage by the filler 6. Also, the area of the pad 40 or electrode 41 is increased in comparison with the third embodiment (see FIGS. 13 and 14), which is advantageous in attaining secure electrical connection.

Figure 22:
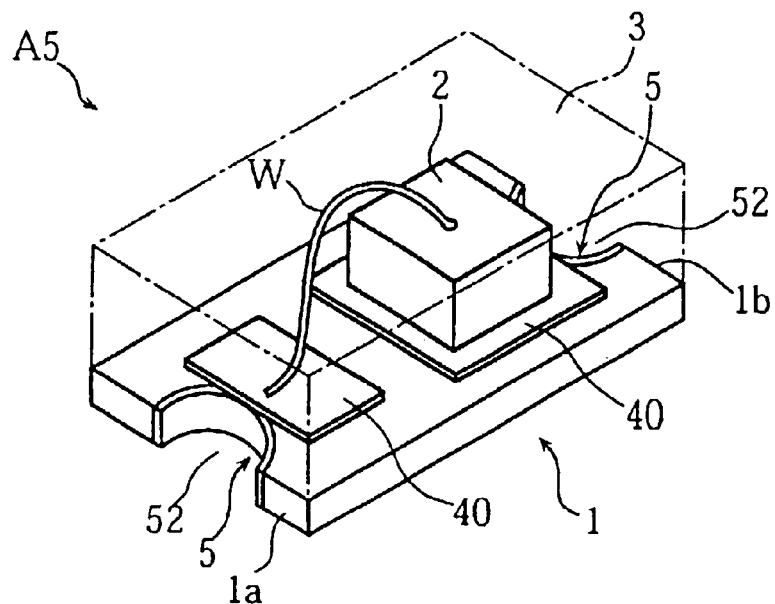
FIG. 22 is a perspective view showing a semiconductor device according to a fifth embodiment of the present invention.

FIG. 22 shows a semiconductor device according to a fifth embodiment of the present invention. The illustrated device A5 includes a diode chip 2 mounted on a substrate 1, two upper pads 40 and two lower electrodes (not shown). The substrate 1 has a generally rectangular plate having shorter ends 1a and 1b. At these ends, the substrate 1 is provided with cutout portions 52 avoiding the four corners of the substrate. Connectors 5 are formed on the wall surfaces of the respective cutout portions 52 for connecting the upper pads 40 to the unillustrated lower electrodes.

Figure 23:
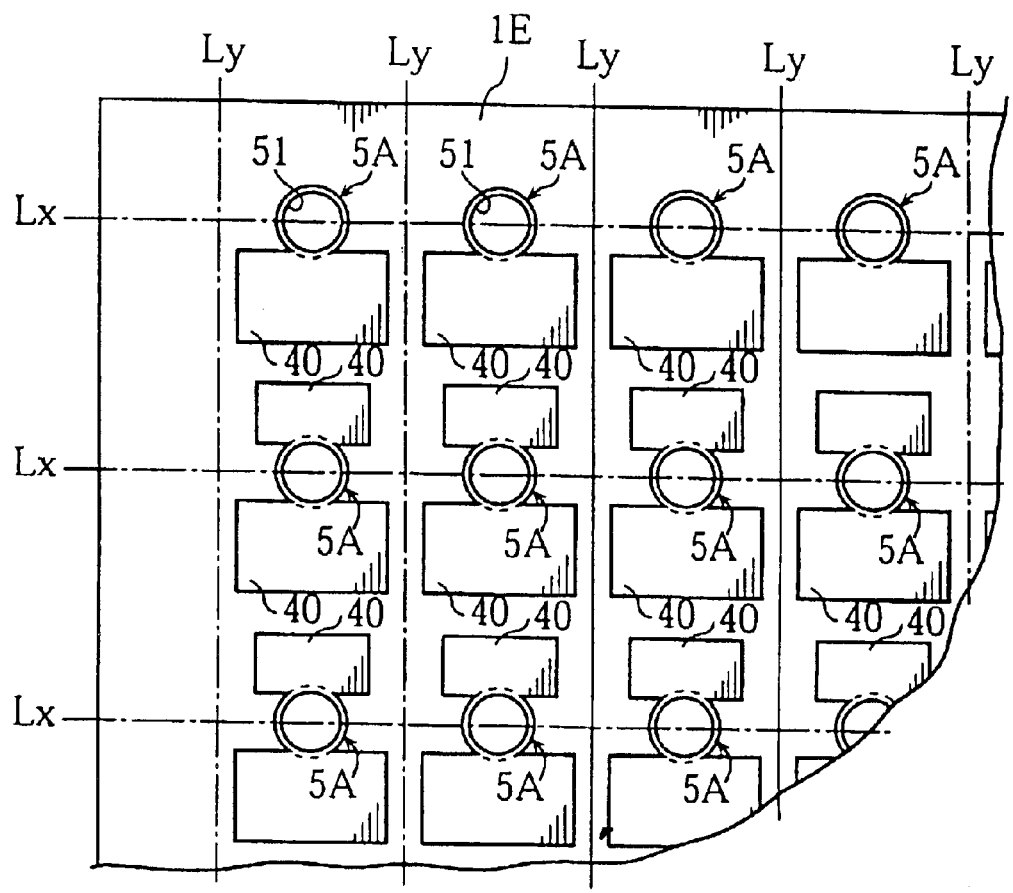
FIG. 23 is a plan view showing a principal portion of a mother substrate used for fabricating the semiconductor device of the fifth embodiment.

The semiconductor device A5 may be fabricated by using a mother substrate 1E shown in FIG. 23. The substrate 1E is formed with a plurality of connection holes 5A connecting the illustrated upper conductive pattern 40 and a lower conductive pattern (not shown). The connection holes 5A are disposed between two adjacent cut lines Ly, while also being intersected by cut lines Lx.

After the substrate 1E is prepared, a semiconductor chip mounting step, a resin coating forming step and a substrate cutting step are performed as in the previous embodiments. In the fifth embodiment, however, each connection hole 5A is halved, but not quartered.

The present invention being thus described, it is obvious that the same may be varied in many ways. Such variations are not to be regarded as a departure from the spirit and scope of the present invention, and all such modifications as would be obvious to those skilled in the art are intended to be included within the scope of the following claims.

What is claimed is:

1. A method or making a semiconductor device, the method comprising the steps of:

preparing an insulating substrate having an obverse surface and a reverse surface;

forming an upper conductive pattern and a lower conductive pattern on the obverse surface and the reverse surface, respectively;

forming a connection hole in the substrate for making an electrical connection between the upper conductive pattern and the lower conductive pattern;

mounting a semiconductor chip an the substrate;

forming a resin coating to enclose the semiconductor chip; and dividing the substrate along cut lines which intersect the connection hole;

wherein the method further comprises a step of providing closure on the obverse surface of the substrate for closing the connection hole, and the closure is divided along the cut lines at the step of dividing the substrate.

2. The method according to claim 1, wherein the cut lines cross each other at a center of the connection hole.

3. The method according to claim 1, wherein the closure prevents the resin coating from entering the connection hole.

4. The method according to claim 1, wherein the resin coating is allowed to enter the connection hole.

5. The method according to claim 1, further comprising the step of filling the connection hole with a filler prior to the resin coating forming step.

6. The method according to claim 5, further comprising the step of providing a conductive layer held in contact with the filler.

7. The method according to claim 1, wherein the closure is made of electroconductive metal, and wherein the divided closure laterally projects from the divided substrate.

* * * * *